United States Patent [19]

McConnell et al.

[11] Patent Number: 4,795,497
[45] Date of Patent: Jan. 3, 1989

[54] METHOD AND SYSTEM FOR FLUID TREATMENT OF SEMICONDUCTOR WAFERS

[76] Inventors: Christopher F. McConnell, 978 S. Gulph Rd., Gulph Mills, Pa. 19406; Alan E. Walter, 606 Brecknock Dr., Exton, Pa. 19341

[21] Appl. No.: 805,203

[22] Filed: Dec. 4, 1985

Related U.S. Application Data

[63] Continuation-in-part of Ser. No. 765,294, Aug. 13, 1985, Pat. No. 4,577,650, which is a continuation-in-part of Ser. No. 747,894, Jun. 24, 1985, Pat. No. 4,633,893, which is a continuation-in-part of Ser. No. 612,355, May 21, 1984, Pat. No. 4,577,650.

[51] Int. Cl.$^4$ .............................................. B08B 5/04
[52] U.S. Cl. ..................................... 134/18; 134/25.1; 134/25.4; 134/98; 134/99
[58] Field of Search ................ 134/1, 18, 99, 98, 25.1, 134/25.4

[56] References Cited

U.S. PATENT DOCUMENTS

| | | | |
|---|---|---|---|
| 4,132,567 | 1/1979 | Blackwood | 134/1 |
| 4,197,000 | 4/1980 | Blackwood | 134/99 |
| 4,577,650 | 3/1986 | McConnell | 134/59 |
| 4,633,893 | 1/1987 | McConnell et al. | 134/95 |
| 4,738,272 | 4/1988 | McConnell | 134/59 |
| 4,740,249 | 4/1988 | McConnell | 134/25.4 |

Primary Examiner—Curtis R. Davis
Assistant Examiner—Sharon T. Cohen
Attorney, Agent, or Firm—Lahive & Cockfield

[57] ABSTRACT

A method for the fluid treatment of semiconductor wafers includes a treatment vessel having opposed first and second ports, and means for holding wafers in a flow path therebetween. A flow segment comprising in sequence, a first vent, a first valve, an inlet, a second valve and a second vent extends between the first and the second port so as to constitute, together with the vessel, a closed fluid loop.

Preferably, the first and second ports are top and bottom ports, with a flow path extending vertically therebetween. The loop is maintained hydraulically full, whereby filling the vessel with a treatment fluid at the inlet, flushes a preceding treatment fluid from the system. A sequence of treatment fluids of differing densities may be provided at the inlet, and a vent and a valve are controlled to fill the loop from the bottom, in the event the treatment fluid is denser than the preceding fluid, or from the top, in the event the fluid is lighter than the preceding fluid. A circulation pump recirculates fluid within the loop.

In another aspect, a fluid delivery system for the delivery of a sequence of high purity treatment fluids to a treatment vessel includes a measuring tank having opposed ports and configured for plug flow between the ports, and a metering pump having its inlet connected to a said port for withdrawing metered amounts of fluid from the tank. A plurality of reservoirs of treatment fluid are each connected via a respective associated valve to one of the said ports. The tank is maintained hydraulically full, so that actuating the pump to withdraw a metered volume of fluid from the tank, and opening a valve associated with a selected treatment fluid draws the metered volume of the selected treatment fluid into the tank. Passive or non-mechanical means is provided for delivering the contents of the tank to a treatment vessel.

In a preferred embodiment, the opposed tank ports are top and bottom ports, and the treatment fluids are fluids of differing densities, with the fluids of lesser density each connected via an associated valve to the top port, and the fluids of greater density each connected via an associated valve to the bottom port, minimizing convective mixing during metered filling. A mixing tank may be provided, between the measuring tank and the treatment vessel. Mixing may be accomplished by bubbling a gas through the fluid held in the mixing tank.

Methods according to the invention for cleaning semiconductor wafers are disclosed.

12 Claims, 4 Drawing Sheets

METHOD AND SYSTEM FOR FLUID TREATMENT OF SEMICONDUCTOR WAFERS

CROSS REFERENCE TO RELATED APPLICATIONS

This application is a continuation-in-part of copending application Ser. No. 765,294, filed Aug. 13, 1985 for "Process and Apparatus for Treating Wafers with Process Fluids" now U.S. Pat. No. 4,577,650 which is a continuation-in-part of application Ser. No. 747,894, now U.S. Pat. No. 4,633,893 filed June 24, 1985 for "Process and Apparatus for Treating Semiconductor Wafers", which is a continuation in part of application Ser. No. 612,355, filed May 21, 1984, now U.S. Pat. No. 4,577,650 for "Method for Treating Wafers with Fluids", and is further related to application Ser. No. 747,895, now U.S. Pat. No. 738,272 filed June 24, 1985 for "Vessel and System for Treating Wafers with Fluids". The disclosure of each of these applications is incorporated herein by reference, and reference thereto is made for further details of the design and operation of hydraulically full wafer treatment systems.

BACKGROUND OF THE INVENTION

This invention relates to the manufacture of semiconductor components, and specifically to wet treatment of semiconductor wafers prior to or as part of certain fabrication steps. In particular, the invention relates to methods and systems for the cleaning of semiconductor wafers prior to diffusion, ion implantation, epitaxial growth, or chemical deposition steps, and also relates to methods for the wet processing of wafers, such as etching by treatment with fluids.

BRIEF DESCRIPTION OF THE PRIOR ART

In the fabrication of semiconductor wafers several process steps require contacting the wafers with fluids. Examples of such process steps include etching, photoresist stripping, and prediffusion cleaning. Often the chemicals utilized in these steps are quite dangerous in that they may comprise strong acids, alkalis, or volatile solvents.

The equipment conventionally used for contacting semiconductor wafers consists of a series of tanks or sinks into which racks of semiconductor wafers are dipped. Wafer carriers are described, for example, in U.S. Pat. Nos. 3,607,478, 3,964,957 and 3,977,926. Such conventional wet processing apparatus poses several difficulties.

Since the tanks are open to the atmosphere, airborne particulates can enter into the process solutions. Through surface tension these particles are easily transferred to the wafer surfaces as the wafers are dipped into and lifted out of the sinks. This particulate contamination is extremely detrimental to the microscopic circuits which the fabrication process creates. It is especially important to minimize particulate contamination during prediffusion cleaning.

Also, since the process chemical tanks are open, operators are exposed to the dangerous chemicals. This is a recognized safety concern. Furthermore, the chemicals must be regularly replaced with new solutions, and this is generally accomplished by aspirating the solution out of the sink and pouring fresh solution from a bottle into the sink. Clean room operators usually wear face masks, gauntlet gloves, and chemical aprons to prevent injury during the manual replacement of process fluids.

Process disadvantages are also apparent for the sink-type method. As the chemicals age, they become contaminated with impurities from the air and from the wafers. The treatment of the last batch of wafers prior to fluid rejuvenation may not be as effective as treatment of the first batch of wafers in a new solution. Non-uniform treatment is a major concern of semiconductor process engineers.

Conventional wet process station sinks are characterized by stagnant conditions. Chemical process reactions occur at the surface of the wafer, and stagnant conditions yield boundary-layer or "filming" phenomena which result in certain areas of the wafer receiving less chemical action than others. This is undesirable and could be particularly crucial in an etching operation. Good temperature control may also suffer because of stagnant conditions. Wet process equipment manufacturers have attempted to incorporate agitating means to circumvent these problems. One method attempting to overcome non-uniform etching is disclosed in U.S. Pat. No. 3,434,543.

After fluid processing the wafers normally need to be dried. This can be particularly challenging because it is important that no contamination be created during the drying process. Evaporation is undesirable since it often leads to spotting or streaking. Even the evaporation of ultra high purity water can lead to problems, because such water is very aggressive to the wafer surface and will dissolve traces of silicon and silicon dioxide. Subsequent evaporation will leave residues of the solute material on the wafer surface. Contamination and other causes of semiconductor failure are discussed, for example, in J. Schadel, "Device Failure Mechanisms in Integrated Circuits", *Solid State Devices* 1983 Conf. Ser. No. 69 (Institute of Physics, London 1984) 105–120.

A device known as a spin-rinser-drier is often used to dry wafers without water evaporation. These machines utilize centrifugal force to "throw" the water off the wafer surfaces. Problems can arise with wafer breakage because of the mechanical strain placed on the wafers, particularly with larger wafer sizes. Manufacturers are also challenged to minimize particulate generation in these usually somewhat complicated mechanical devices. Notwithstanding these drawbacks, some manufacturers have extended the spin-rinser-drier technology to general fluid processing.

Machines known as "acid processors" are now available which spray the process fluids onto wafer surfaces. These machines offer the advantage of conserving chemical reagents while at the same time permitting each batch of wafers to be exposed to fresh solutions.

The difficulties with spin-rinser-driers in terms of particle generation and mechanical complexity are compounded in acid processors. Instead of just high purity water, acid processors must deal with the aggressiveness of hot corrosive acid used in fluid processing. The problems of mechanical breakdown and particulate generation are inherent in acid spray processors.

Spray methods also introduce new process difficulties. Because only a small amount of reagent is utilized, it is nearly impossible to achieve high temperature processing. In prediffusion cleaning, for example, it is desirable to expose the wafers to concentrated sulfuric acid at a temperature between 80 and 150 degrees centigrade. Because the heat capacity of the sprayed solution is not very great, especially relative to the wafers themselves, it is nearly impossible to achieve the desired temperature on the wafer surface. The uniformity and control of temperature in acid processors is questionable. Similarly, it is difficult to achieve uniformity and control of processes such as hydrofluoric acid etching in which a relatively fast chemical reaction is taking place.

Even safety concerns are not obviated by enclosed acid processors. The spray nozzles of these machines use relatively high pressures to achieve the correct spray pattern. When such dangerous chemicals are pressurized, there is the possibility of an accident.

What is needed in the area of semiconductor wet processing is an apparatus and process which can bring process chemicals into contact with semiconductor wafers in such a manner that: (a) atmospheric contamination is avoided, (b) personnel exposure to the chemicals is minimized, (c) uniform treatment of the wafer is promoted, (d) fast and effective heat transfer is allowed, (e) stagnant conditions are minimized and "filming" effects are avoided, (f) the machine is mechanically simple, and (g) aggressive chemicals are handled safely.

OBJECTS AND SUMMARY OF THE INVENTION

It is an object of the invention to provide a system for the fluid treatment of semiconductor wafers in which the treatment fluids do not contact the atmosphere.

It is an object of the invention to provide a system for the fluid treatment of semiconductor wafers in which treatment fluids are maintained in a circulating loop during treatment.

It is an object of the invention to provide a system for the fluid treatment of semiconductor wafers in which the temperature and flow of treatment fluids may be precisely controlled.

It is an object of the invention to provide a system for the fluid treatment of semiconductor wafers in which small amounts of treatment fluids are required.

It is an object of the invention to provide a system for the fluid treatment of semiconductor wafers in which treatment fluids may be successively measured and introduced to a treatment vessel without contacting contaminant-generating moving components.

It is an object of the invention to provide a system for the fluid treatment of semiconductor wafers in which the entire treatment system may be conveniently flushed using small amounts of fluid.

It is an object of the invention to provide a system for the fluid treatment of semiconductor wafers which is adapted to treatment using different treatment fluids.

It is an object of the invention to provide a system for the fluid treatment of semiconductor wafers in which overpressure conditions cannot occur.

These and other objects of the invention are attained by providing a treatment vessel for holding a plurality of semiconductor wafers, attached in a closed fluid loop. A fluid delivery system provides treatment fluid to the loop to hydraulically fill it. A circulation pump or other fluid mover then causes the fluid to circulate in a controlled manner for treating the wafers.

In one aspect of the invention, the system for the fluid treatment of semiconductor wafers includes a treatment vessel having opposed first and second ports, and means for holding wafers in a flow path therebetween. A flow segment extends between the first and the second port so as to constitute, together with the vessel, a closed fluid loop. The flow segment comprises, in sequence, a first vent, a first valve, an inlet, a second valve and a second vent, so that by providing a fluid under pressure at the inlet, and selectively opening a valve and a vent, the vessel can be filled or drained through either the first or second port.

The vessel and the flow segment are each designed to have no recesses, corners, or dead spaces which might retain fluid therein, so that the loop may be sequentially filled with various treatment fluids without leaving residues to cross-contamiminate the successive fluids. Preferably the loop is maintained hydraulically full, and as the vessel is filled with a treatment fluid from the inlet, a preceding treatment fluid is thereby flushed from the system.

Preferably, the first and second ports are top and bottom ports, with a flow path extending vertically therebetween. Preferably, a sequence of treatment fluids of differing densities are provided at the inlet, and a vent and a valve are controlled to fill the loop from the bottom, in the event the treatment fluid is denser than the preceding fluid, or from the top, in the event the fluid is lighter than the preceding fluid. Preferably, the loop includes a circulation pump or other means for recirculating fluid within the loop.

In another aspect, the invention includes a fluid delivery system for the delivery of a sequence of high purity treatment fluids to a treatment vessel. The delivery system includes a measuring tank having opposed ports and configured for plug flow between the ports, and a metering pump having its inlet connected to one of the ports for withdrawing metered amounts of fluid from the tank. A plurality of reservoirs of treatment fluid are each connected via a respective associated valve to one of the ports. The tank is maintained hydraulically full, so that by opening a valve associated with a selected treatment fluid and actuating the pump to withdraw a metered volume of fluid from the tank, the metered volume of the selected treatment fluid is drawn into the tank. Passive or non-mechanical means is provided for delivering the contents of the tank to a treatment vessel. In this manner, the treatment fluids supplied to the treatment vessel are accurately metered, without having been in contact with possible sources of contamination, such as pump seals or moving mechanical parts.

Preferably, the means for delivering the contents of the tank includes gas pressure means for expelling the fluid in the tank through a port at the bottom of the tank. Preferably, the opposed tank ports are top and bottom ports, and the treatment fluids are fluids of differing densities, with each fluid of lesser density connected via its associated valve to the top port, and each fluid of greater density connected via its associated valve to the bottom port. In this manner convective mixing during metered filling is minimized. In a further preferred embodiment, a mixing tank is provided, between the measuring tank and the treatment vessel, for receiving metered amounts of fluid from the metering tank and homogeneously mixing the fluid before delivery to the treatment vessel. Such mixing may be accomplished by bubbling a gas through the fluid held in the mixing tank. In one preferred embodiment, the treatment fluid is a cleaning fluid, and a reactive gas, such as ozone, is bubbled through the fluid to enhance its cleaning power.

BRIEF DESCRIPTION OF THE DRAWINGS

The foregoing summary and objects of the invention, and the various features thereof, as well as the invention itself, may be more fully understood from the following description, when read together with the accompanying drawings, in which.

Like reference characters in the respective drawn figures indicate corresponding parts.

DESCRIPTION

Figure 3:
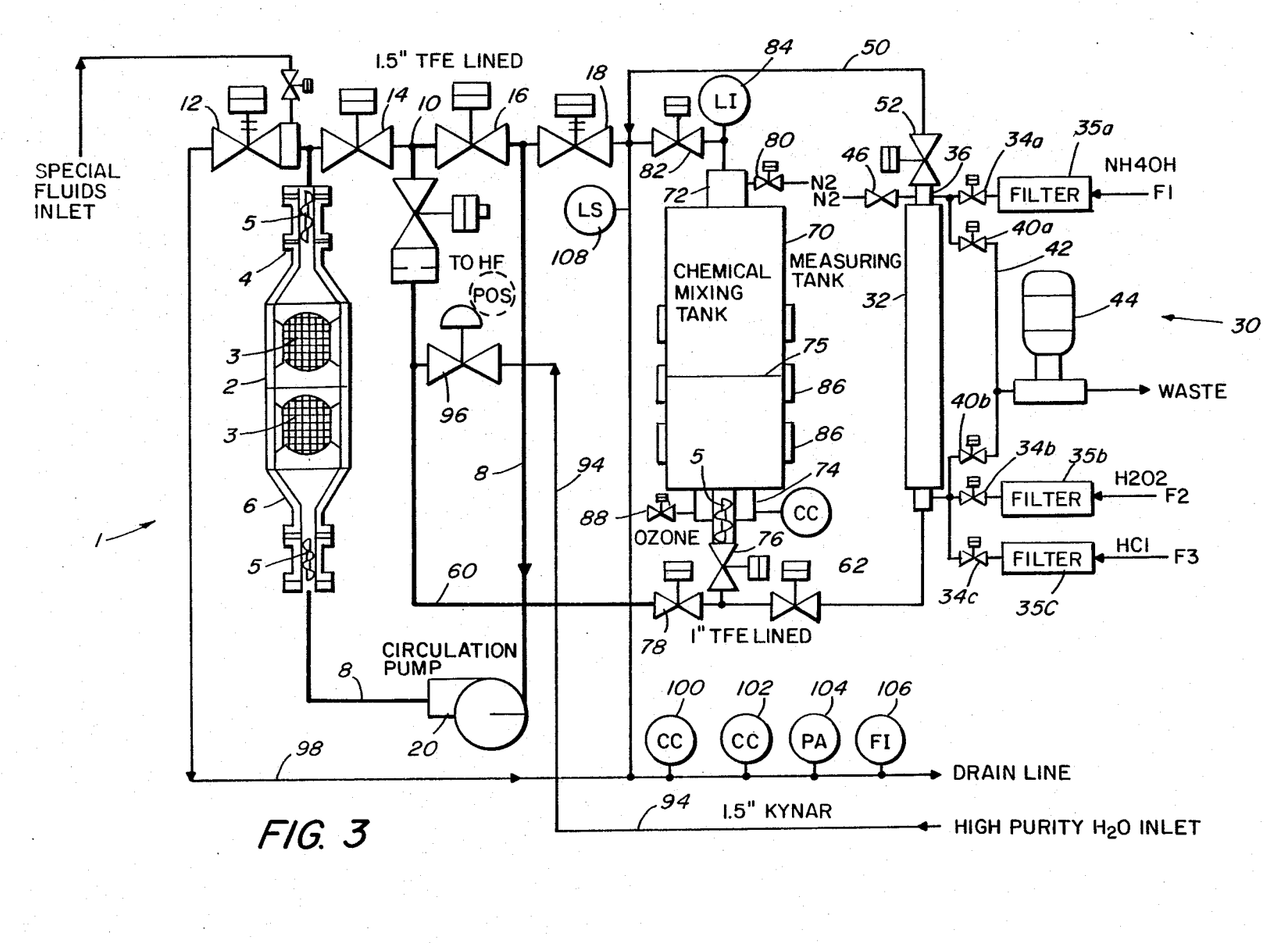
FIG. 3 is a schematic view of a system for the teeatment of semiconductor wafers according to the present invention.

The system of the invention, shown in FIG. 3 is adapted to carry out the treatment of semiconductor wafers with a plurality of fluids, and includes a fluid loop for receiving and circulating a fluid past the wafers, and a fluid delivery system for supplying successive treatment fluids to the wafers. The primary constraint of wafer processing, described more fully in the above-referenced earlier filed applications, is that treatment fluids of exceptionally high purity must be used, and this purity must be maintained throughout the treatment. Because of the expense of the high quality fluids required, it is desirable to use relatively small amounts of fluid. This goal is largely inconsistent with the necessity for effectively removing each preceding process fluid and all contaminants from the wafers. Furthermore, in designing a system for the sequential treatment with a plurality of process fluids, it is desirable to eliminate the exposure of such fluids to contamination arising from the various pumps, valves and other mechanical parts necessarily used in such a system.

Figure 1:
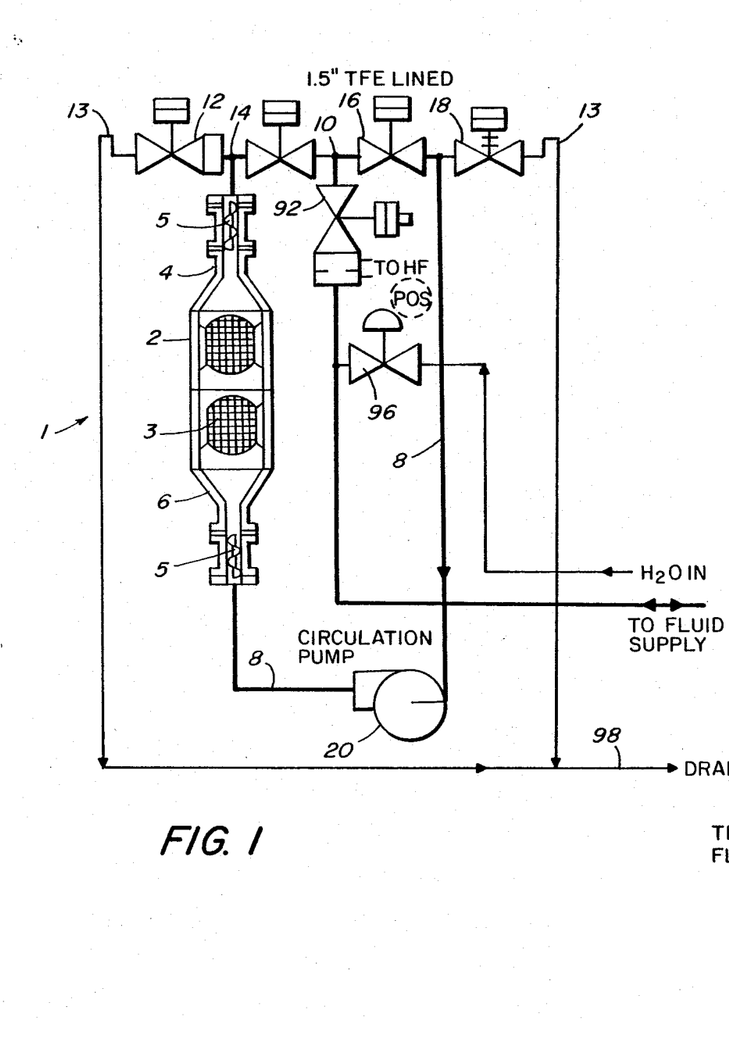
FIG. 1 is a schematic drawing of a treatment vessel and flow loop according to the invention.

The embodiment described in FIG. 3, discussed below, achieves treatment fluid purity, in one aspect, by providing a closed fluid loop in which the treatment fluid may be circulated so as to provide a uniform exposure of wafers to the fluid at controlled flow and temperature conditions, while permitting efficient and complete changing of the fluids in the loop. FIG. 1 shows a simple schematic diagram of this portion of the system, which will be more readily understood by detailed reference thereto.

Figure 2:
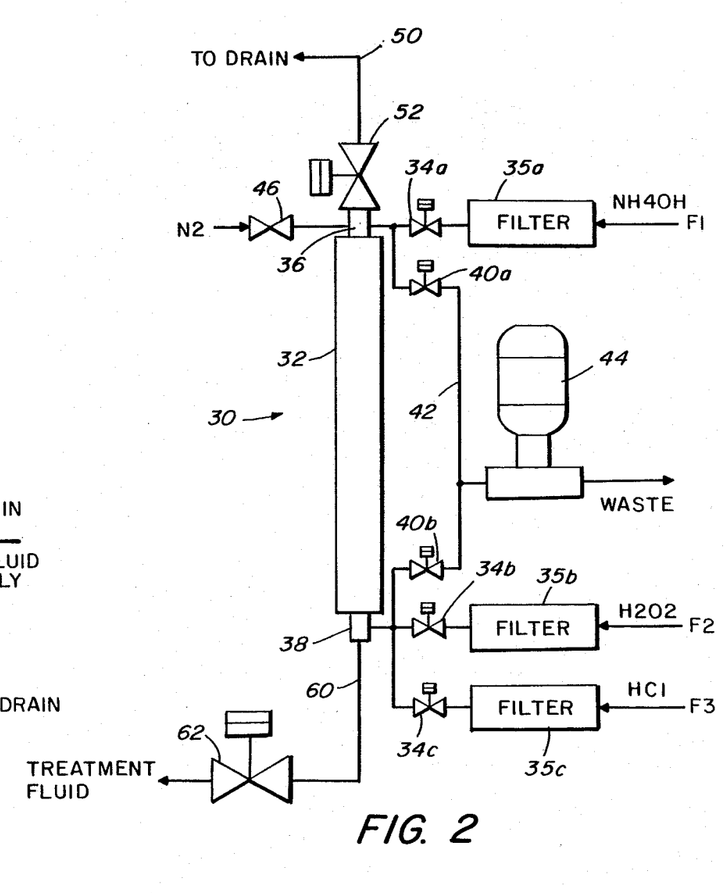
FIG. 2 is a schematic view of a fluid delivery system according to the present invention.

In another aspect, the system of FIG. 3 includes a fluid delivery system in which a plurality of different treatment fluids may be mixed and delivered to the loop without contaminating or being contaminated by any mechanical parts other than the necessary valves and conduits, while efficiently conserving such fluids. FIG. 2 shows a simplified schematic diagram of this portion of the system of FIG. 3. Accordingly, FIGS. 1 and 2 will be discussed before the detailed discussion of the preferred wafer treatment system, FIG. 3.

FIG. 1 shows a schematic diagram of the fluid treatment loop 1 of the present invention, in which a vessel 2 containing one or more semiconductor wafer carriers 3 is connected in a fluid system for treating the wafers with fluid. A suitable vessel 2 is disclosed in each of the above referenced patent applications, and comprises first and second fluid ports 4, 6, and means 3 for supporting semiconductor wafers in a flow path between the ports. A conduit 8 interconnects the ports 4, 6 so as to form, together with the flow vessel 2, a loop in which fluid may circulate. Fluid is introduced via inlet 10 located in the conduit 8 between its ends. The conduit 8 includes, in series, a first vent 12, a first blocking valve 14, an inlet 10, a second blocking valve 16, and a second vent 18. With this configuration, by opening the first vent 12 and the second valve 16, the vessel 2 may be filled through its second port 6. Alternatively, by opening the second vent 18 and the first valve 14, the vessel 2 may be filled through its first port 4. Preferably, inlet 10 comprises an instrument tee having smooth blunt ends for preventing entrapment of fluids therein, and preferably the distance from tee 10 to valves 14, 16 is minimized so as to eliminate dead legs in the conduit system during the filling operation. Each vent 12, 18 preferably communicates to the drain over a slight vertical rise, shown schematically at 13, to minimize backflow problems. All components are lined with inert material, and preferably with material which is impermeable and non-adsorbent for the fluids used.

As shown in FIG. 1, the loop 2, 8, 10, 12, 14, 16, 18, also includes a pump 20 for circulating fluid in the loop. Pump 20 is a variable speed pump, controllably operated at between 60 and 3,000 RPM, with a peak capacity in the range of 200 liters per minute. After filling of the loop, a valve (not shown) controlling the fluid supply to inlet 10 is closed and both valves 14, 16 are opened, permitting circulatory flow in the loop. Pump 20 is turned on at a slow speed, and its speed increased to circulate the fluid through vessel 2 for treatment of the wafers therein. In a preferred embodiment, the volumetric capacity of vessel 2 is approximately 3 liters, with the conduit 8 comprising another 3 liters or 50% of the total treatment volume. Vessel 2 includes flow expansion and flow extraction portions (which terms are relative to the direction of the flow) which may comprise helical spinners 5 for imparting plug flow to fluid entering or leaving the vessel. Suitable mechanisms are those described, for instance, in the above referenced applications, Ser. Nos. 612,355 and 747,894 now abandoned.

Once valves 14, 16 are opened, and the pump 20 is turned on, the fluid circulates in the fluid loop defined by vessel 2 and conduit 8. At this point, either one of vents 12, 18 may be fully opened without loss of fluid from the loop. Preferably, vents 12, 18 are spring-loaded, normally-open vents, so that, if the failure of the control system for the various valves and vents should occur, treatment fluids will flush harmlessly out of the vents to the drain, and no excessive pressure buildup will occur. Preferably vents 12,18 are air-actuated valves, and are "tied" together, so that closing of one vent automatically opens the other. Pump 20 is a centrifugal pump which allows fluid to freely flow past it when the pump is turned off, as, for instance, during the filling of the loop. By initially running pump 20 at a low speed and by providing an open vent in the loop, it is possible to operate the loop in a hydraulically full condition without using a surge tank.

It will be understood that various multiport two- or three-position valves may be substituted in the loop for certain groups of two or more valves shown in the figures. Thus, for example, the open/closed valves 14, 16, 92 may all be replaced by one three-port, three-position valve which may be positioned to interconnect any pair of its ports. Similarly, the valve 12 to the drain and blocking valve 14 may be replaced by a suitable three port two-position valve, with the common port connected to inlet 10. Thus the alternative use of such ballcock or similar multiple valves is included in the description and scope of the invention herein.

Turning now to FIG. 2, there is shown a simplified schematic diagram of a fluid delivery system 30 for measuring high purity fluids and delivering such fluid to the inlet 10 of the fluid loop, according to the present invention, in a semiconductor wafer treatment system. Delivery system 30 includes a meauring tank 32 and a plurality of sources of treatment fluids F1, F2, F3, each connected to the mixing tank 32 by a respective valve 34a, 34b, 34c. Tank 32 has a port 36 at its top and a port 38 at its bottom, with the respective valves 34a, 34b, 34c each connected to one of the ports, as explained more fully below. A first valve 40a is oonnected to port 36 and a second valve 40b is connected to port 38 with the other side of each valve connected to a common manifold 42 leading to an input of a metering pump 44. The output of pump 44 connects to a drain. At the top of tank 32, a source of pressurized gas, shown illustratively as N2, connects through valve 46 to the tank. Conduit 50, communicating with the drain, connects to top port 36 via valve 52. Finally, conduit 60 connects to bottom port 38 via valve 62 for carrying metered fluids from the tank, and solvent, rinse or make-up fluids to the tank. In the system disclosed, line 50 is a drain and line 60 is the fluid output of the system.

Fluid delivery system 30 is used to measure fluids for delivery to a treatment vessel as follows. Tank 32 is maintained in a hydraulically full condition with all valves 34a, 34b, 34c, 40a, 40b, 46, 52, 62 closed. In this disclosure and the attached claims, when used in connection with the metering tank, the term "hydraulically full", means full of liquid, without gas pockets or phase boundaries. The hydraulic filling may be accomplished, for instance, by initially opening valve 52 to the drain and valve 62 to a water source so as to fill the tank with water up to the level of the drain, and then closing said valves. Tank 32 is long and thin; in one prototype embodiment it has dimensions of 2 inches diameter by 52 inches length. It will be understood, however, that the volume of tank 32 may be selected according to the fill volume of a representative cycle of the treatment system designed, or according to the volume of fluids to be metered into such a system.

When it is desired to introduce a treatment fluid F1, F2, etc. into the tank in a measured amount, the valve corresponding to the desired treatment fluid is opened so as to connect that treatment fluid to a port 36 or 38 of tank 32. The valve (40a or 40b) which connects the metering pump 44 to the opposing port of tank 32 is also opened. Pump 44 is then turned on to withdraw the metered amount of fluid from the hydraulically full tank 32, thereby causing fluid from the reservoir of selected fluid to enter the tank. Illustratively if it were desired to introduce the treatment fluid F2 into tank 32, the valve 34b is opened to connect that fluid to port 38, and the valve 40a is opened to connect the metering pump 44, via the manifold 42, to the opposing port 36. Because the tank is full of liquid, the withdrawal through port 36 of the fluid from the tank causes an identical volume of fluid F2 to enter the port 38. In this manner, a single pump 44, can be used to meter quantities of a plurality of fluids F1, F2, etc. It will be appreciated that the accuracy of the metering could be impaired if the selected entering fluid were pumped out of the tank 32 during metering. Accordingly, tank 32 is configured for plug flow, so that entering fluid substantially uniformly displaces the fluid ahead of it in its flow direction. With this geometry, a substantial proportion, e.g., over 50%, of tank 32 may be filled with a fluid in this manner without loss of accuracy.

In this regard, it will be observed that the various fluid F1, F2, F3 are connected to different ports 36, 38. In the embodiment shown, port 36 is a top port and port 38 a bottom port, with lighter fluid F1 connected to the top port and denser fluids, F2, F3 connected to the bottom port. In this fashion, when a fluid is drawn in through a port, it must flow against its natural flotation gradient into the tank. This method of introduction prevents convective mixing of the fluids, and further enhances and contributes to plug flow in the tank to maintain metering accuracy. All of the fluids F1, F2, F3, and the $H_2O$, are high purity fluids for the treatment of semiconductor wafers. Because each fluid is drawn into the tank without actually contacting the pump, the mixed fluids in the tank are of a purity equal to those initially supplied to it. Thus, the metering step introduces no contamination to the fluids Continuing with the example disclosed, after a desired amount of fluid F2 is introduced into the tank, valve 34b and valve 40a are again closed and valve 62, connecting the bottom port 38 to the outlet conduit 60, is opened. Valve 46 is also opened, causing a pressurized non-reactive gas to bear against the top of the fluid in the tank, driving the fluid in the tank out through the conduit 60. The pressurized transport gas is also of high purity. Thus, the transportation of the fluid is accomplished without moving mechanical parts, further avoiding the introduction of contaminants.

Preferably, conduit 60 is connected to a second tank, as in the embodiment of FIG. 3, discussed below. The second tank serves as an accumulating and mixing vessel, in which phase separation may occur, thus permitting delivery of bubble-free fluid to the wafer cleaning system. After the fluid F2 is delivered from tank 32 through conduit 60, valve 46 is closed and valves 52 and 62 opened, allowing water to flow into port 38, through the tank 32 to port 36, through conduit 50 to the drain. Simultaneously, metering pump 44 is turned on, and valves 40a and 40b each alternately opened and closed, so as to draw rinse water through the manifold 42 and each leg of its connecting pipes and valves. This rinses the metering system 30 and measuring tank 32, and re-establishes the hydraulically full condition, so that the tank is again ready for metering of fluids and delivery thereof to the treatment system.

It will be appreciated that during the metering of fluids, pump 44 withdraws substantially pure water, and thus becomes minimally contaminated between pumping cycles. More importantly, the fluid which does contact pump 44 does so directly en route to a drain, so that the pump introduces no contaminants such as lubricants or particulate matter into the system. Further, residual treatment fluid in tank 32, which might be detrimental to subsequent processing steps, is purged from tank 32 before each metering cycle. It will be appreciated that while FIG. 2 shows three treatment fluids F1, F2, F3, a significantly larger number of fluids may be connected by respective valves to the ports of the tank for measuring thereof. Furthermore, two or more such fluids may be measured in a single cycle before delivery through line 60 to an accumulating tank or to the treatment system. Thus the fluid delivery system 30 offers a high degree of versatility for measuring and delivering a complex sequence of fluids using evacuative flow measuring and purging, while introducing none of the contaminants commonly associated with fluid metering and transport systems.

FIG. 3 shows a schematic view of a wafer treatment system according to the present invention, with additional structures which permit the ready interchange or adaptability of the system to diverse fluid treatment reagents and protocols. For purposes of illustration, the operation of the system will be described below with reference to a number of particular treatment fluids useful in cleaning semiconductor wafers. It will be appreciated, however, that the invention includes a system and method not only for high purity cleaning and rinsing operations, but also for other wafer processing operations. Such processing operations may include "wet", e.g., liquid, treatment, or the flow treatment with gas or vapor fluids.

As shown in FIG. 3, a preferred system according to the present invention comprises a flow loop portion 1 and a fluid measuring portion 30, as previously described in reference to FIGS. 1 and 2, respectively. Within each of these portions, corresponding parts e.g. vessels, tanks, valves, conduits and pumps, are numbered identically to the numbering of FIGS. 1 and 2. Thus, treatment loop 1 includes a vessel 2, a first vent 12, a first valve 14, an inlet 10, a second valve 16 and a second vent 18 connected via conduit 8 in a loop running between top and bottom ports 4, 6 of the vessel. Similarly, fluid metering system 30 contains all the elements referred to by numerals in FIG. 2. It will be seen that the output conduit 60 of the metering system 30 is connected to inlet 10 of the loop.

Intermediate between the measuring portion 30 and the fluid treatment loop 1 in the embodiment of FIG. 3 is a chemical mixing tank 70 having a top port 72 and a bottom port 74. Mixing tank 70 is larger than measuring tank 32, and has a volume sufficient to fill the treatment loop 1. Mixing tank 70, unlike fluid vessel 2 and measuring tank 32, is not maintained hydraulically full, but may have a phase boundary 75 between the fluid therein and gas or vapor in the upper portion of the tank. A valve 76 connects fluid line 60 to the bottom port 74 of the mixing tank. Another valve 78 located downstream of valve 76 along line 60 may be closed so as to divert the flow of fluid in line 60 to the mixing tank. The top port 72 of the mixing tank is connected via valve 80 to a source of pressurized gas which may be used to propel fluid from the tank into the loop, in a manner similar to that discussed for the measuring tank in relation to FIG. 2. Also connected to port 72 is an outlet valve 82 leading to the drain.

A level and temperature indicator 84 is attached at the top of tank 70, and heater elements 86, controlled in accordance with the temperature indication, surround tank 70 for heating the fluid in the tank to a selected temperature. At the bottom of tank 70 is a pressurized gas inlet valve 88 for introducing pressurized gas, bubbled through the fluid, to promote mixing. In the preferred example of a wafer cleaning system discussed below, the pressurized gas is ozone which serves the dual functions of agitating the fluid, and providing a reactive species for inhibiting etching and for oxidizing organic contaminants from the wafers. Also at the bottom port 74 of the tank is a conductivity sensor 90 for monitoring the conductivity of the fluid admitted or discharged through port 74. A plug flow imparting element, similar to 5 of FIG. 1 may be used at port 74.

Conduit 60, running from the measuring tank 32 to the inlet 10 via valve 92, thus may be connected to the bottom port 74 of mixing tank 70 by selectively opening or closing valves 62, 76, 78. A main water inlet line 94 is also connected, via positioning valve 96, to line 60 at a point thereof near the inlet valve 92 to the vessel treatment loop. Inlet line 94 supplies a flow of high purity water, at a rate determined by the position of the positioning valve 96, to line 60. By closing valve 78, and opening valve 92, the high purity water flows directly into the fluid treatment loop 2, 8, 10, 12, 14, 16, 18. Similarly, by closing valve 92 and opening valve 78, water flows along line 60 to either mixing tank 70 or measuring tank 32. Thus, conduit 60 serves the dual function of providing, in a first direction, a flow of treatment fluid from tanks 32, 70 to the treatment vessel 2, and providing, in a reverse direction, a flow of rinse water or makeup water for the tanks 32, 70.

In this regard, it should be noted that the conductivity sensor 90 at the inlet to tank 70 will provide a resistance reading indicative of the purity of the water flowing therethrough. Sensor 90 will also provide a high (infinite) resistance reading if the fluid in tank 70 passes entirely out of the tank. Such a condition may arise when, for instance, the pressurized gas at inlet valve 80, for driving the fluid in the mixing tank into the treatment loop, entirely empties tank 70. This is to be avoided because, as explained more fully in the prior referenced patent applications Ser. Nos. 612,355, 747,894 now abandoned and 765,294, now U.S. Pat. No. 4,577,650 the fluid treatment loop is maintained in a hydraulically full condition, so as to avoid phase transitions in the treatment fluid and to provide more uniform and efficient wafer-fluid contact. In addition, in the present treatment loop, a hydraulically full condition is desired to permit circulation in the loop with either the vent 12, or vent 18 open, thereby avoiding the occurrence of pressurized conditions in the treatment vessels which, with the high-temperature reactive fluids used, could be dangerous. Preferably, the vents 12, 18 are spring-loaded fail-open valves.

As used in this disclosure and in the claims, the term "hydraulically full", when used in reference to the treatment vessel or treatment loop, includes the term fluidically full, and means the vessel or loop is full of a liquid, or a gas or vapor, having no phase boundaries, so that the fluid may circulate in a uniform fashion, without droplets, films or other irregularities which could degrade the wafer treatment process.

All of the vents in the system, 12, 18, 82, 52 connect to a common drain 98. At the downstream end of drain 98 are a plurality of sensors 100, 102, 104, 106. As shown, sensors 100, 102 are resistivity or conductivity sensors similar to sensor 90, except that one is a high range sensor and the other a low range sensor, for providing accurate indications of resisitivity or conductivity of fluid passing in the line. Specifically, sensor 102 may be a sensor capable of accurate resistance readings in the range of 1 to 18 megohm-centimeters. Sensor 100 is a similar sensor covering a conductivity range 0 to 20,000 micromhos/centimeter. In addition, a particle analyzer 104 detects and counts particles in the fluid flow in the drain. Drain 98 also has a flow indicator 106, which, alternatively, may be placed on the distilled water inlet line 94. For the flow indications of interest, with the system operated in a hydraulically full state, the measurement of flow in the drain will provide an accurate indication of the flow into the system along line 94, and for this reason the placement of flow indicator 106 on the drain is preferred.

In addition to the sensor and indicators already described, a liquid sensor 108 is provided along the common drain line 50 of tanks 32, 70 to provide an indication when one of those tanks has been entirely filled with fluid, as occurs during the backwash rinsing operation. A liquid sensor, in the conduit 8, a pressure indicator, and a temperature indicator may monitor the fluid in the treatment loop. Alternatively, the loop may be insulated, or heated by electric wrap tape, and temperature monitored only in tank 70 and/or drain 98. Filters 35a, 35b, 35c are provided between the sources of treatment fluids and the measuring tank, and a filter may also be provided along the inlet line 94.

Figure 4:
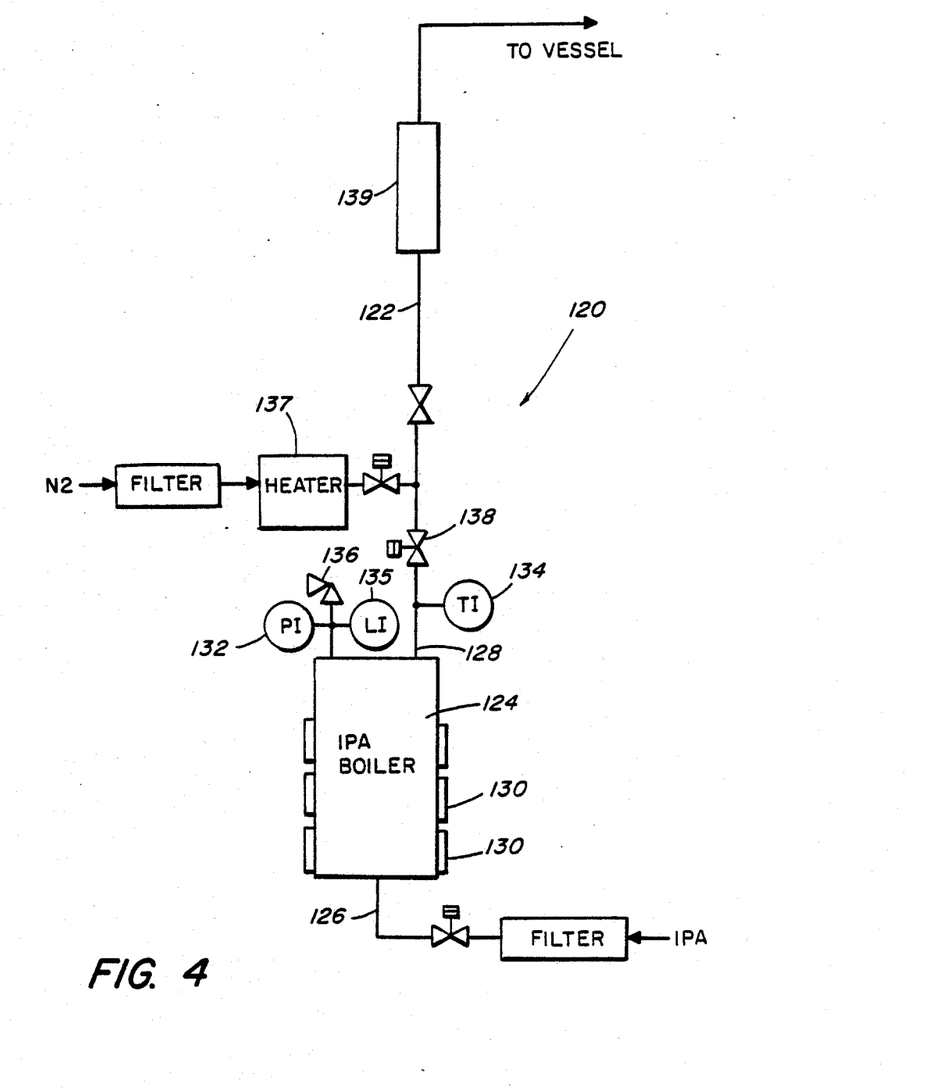
FIGS. 4 and 5 each show fluid systems for use in the preferred embodiment of the invention described herein.

FIG. 4 shows an auxilary fluid delivery system 120 according to a preferred embodiment of the invention for the practice of semiconductor wafer cleaning. Auxiliary fluid delivery system 120 delivers treatment fluid along the line 122 to the upper port 4 of vessel 2. Specifically, system 120 delivers a fluid for drying the contents of vessel 2. This process step inherently cannot be performed with the vessel full of liquid. Nonetheless, it is desired to effect such drying without the formation of bubbles and without leaving droplets on the semiconductor wafers, since droplets, upon drying, leave contaminant residues of the solutes therein. In the preferred embodiment, this is accomplished by providing a flow of heated isopropyl alchohol (IPA). As the alchohol or alchohol vapors are introduced at port 4, fluid in the vessel 2 is displaced downward, out the conduit 8 to vent 18 to a drain. Droplets, including water may remain on wafers and within the vessel. The continued flow of IPA vapor carries off water, and also the IPA vapors combine with such water droplets to form an azeotrope, which evaporates at a lower temperature than either water or the IPA vapors. A flow of clean heated drying gas is then introduced, through heater 137 and filter 139 along conduit 122 into the vessel. The azeotropic residue is carried off in the flow of transport gas. In this manner, the residues associated with conventional drying techniques are substantially reduced.

Continuing with FIG. 4, the auxiliary fluid delivery system 120 includes an alchohol boiler 124 having an inlet 126 and an outlet 128. Heaters 130 maintain the contents of the boiler at high temperature. A pressure indicator 132 provides information for controlling the heat range, and a temperature indicator 134 monitors the temperature of the fluid leaving outlet 128. A safety relief valve 136 is provided at the top of the boiler 124. A valve 138 controls access to delivery line 122. Also connected to line 122 is a source of high temperature gas, which may be, for instance, filtered nitrogen, which is passed through gas heater 137.

To effect drying of the vessel and wafers, the pressurized, vapor IPA is introduced into vessel 2, displacing the fluid therein. Any pressure and temperature drop causes a certain amount of IPA droplet condensation on the wafers and vessel walls, which forms an azeotrope with any remaining water. Continued flow of hot IPA vapor and heated drying medium, as previously described completes the drying step.

In addition to an IPA drying system, it is also possible to operate the wafer treatment system of the present invention, using, for example, heated concentrated $H_2SO_4$ as a treatment fluid. Such a strong acid treatment is commonly used in the semiconductor industry for the removal of gross organic contaminants. As such, it is a much "dirtier" processing step than the other treatment steps described herein, and it is desirable, if such a sulfuric acid clean is used, to admit such fluid through a separate line to the treatment loop in the manner described in regard to FIG. 4, and to drain it either to a separate reservoir for reuse, or to the drain. Details for the construction of a sulfuric acid cleaning system are disclosed in the above-referenced patent application, Ser. No. 765,294 incorporated herein by reference, and accordingly no further details need be given here.

Another treatment fluid which is handled separately from the fluid measured by metering tank 32, is provided by a hydrofluoric acid delivery system, which more generally may be described as a fine-fluids delivery system. This system is shown schematically in FIG. 5. The fine-fluids metering system 140 includes a fluid source or reservoir 142 having inlet and outlet ports 144a, 144b, respectively. Conduit 146b extends from outlet 144b to an inlet of a metering pump 148. An outlet of the metering pump 148 goes to a filter 150, whence the filtered fluid moves by conduit 146c to valve 152. A further conduit 146a extends from the fluid reservoir inlet 144a to valve 152. Valve 152 is a three port, 2 position valve which, in its normal position, connects conduit 146c to conduit 146a so as to define a simple flow loop of the fluid reservoir via the metering pump and the filter back to the fluid reservoir. In its second position, valve 152 shunts the flow from 146c to valve 154. Valve 154 is also a three port, 2 position valve, with the other 2 ports connected to the inlet portion of valve 92 of FIG. 3, on opposing sides of an orifice plate which serves to create a pressure differential across the inlet to the valve, when fluid flows through the valve, thereby creating a scavenging flow in the loop connected to the opposing side of the orifice plate. Such an arrangement is discussed in greater detail in the above referenced Application No. 765,294. It serves to allow very precise timing injection of fluid, as well as to provide an $H_2O$ rinse circulation for valve 154 when valves 152, 154 are not connected in an injection mode. Preferably, valves 152, 154 are tied together, so that when valve 152 is in its first position shunting line 146a to line 146b, valve 154 connects the two injection flow ports at inlet to valve 92. As discussed in the above referenced application Ser. No. 765,294, a five port, four way valve may also be used in place of the two three port, 2 position valves.

Figure 5:
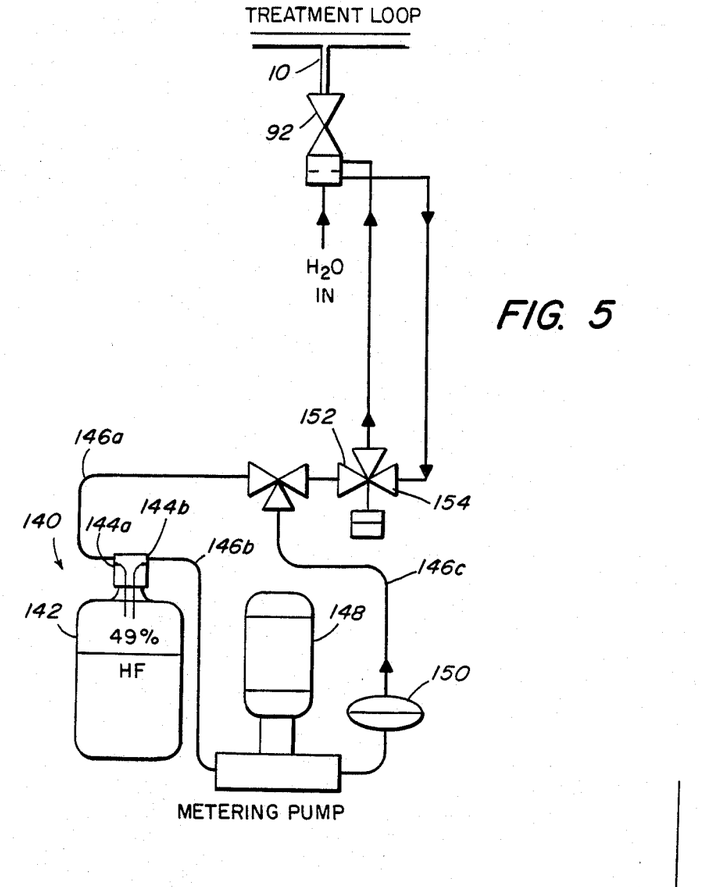

The use of a recirculating flow loop 146a, 146b, 146c in the HF fluid delivery system allows metering pump 148 to operate at a constant speed, thereby enhancing its accuracy. Furthermore, by connecting the flow loop via valve 154 directly at the inlet to inlet valve 92, very exact timing of the HF injection to the treatment loop is obtained, and concentrations, e.g., of 0.5% may be routinely achieved with high accuracy. Preferably treatment fluids delivered by the fine-fluids system, FIG. 5, are not recirculated in the treatment loop 2, 8 but are flowed directly through vessel 2 to the drain. In this regard, accurate control over the inlet water flow into which the HF is injected is maintained by adjusting the positioning valve 96 to obtain a desired flow rate, as measured by flow tranducer 106. Other treatment fluids requiring precise metering or low concentrations may be introduced using similar equipment.

Preferably, each of the valves controlling the inflow of a treatment fluid or a gas into the system is a self rinsing valve, like the three-port two-way valve 156 of FIG. 5, and is connected so that the valve is rinsed during the rinsing of the tank to which it leads. This is accomplished, in a preferred system, by placing the valve for each such fluid or gas directly at the inlet or outlet of a tank, and providing a flow geometry to create a pressure differential for inducing a rinse flow through the valve.

Figure 6:
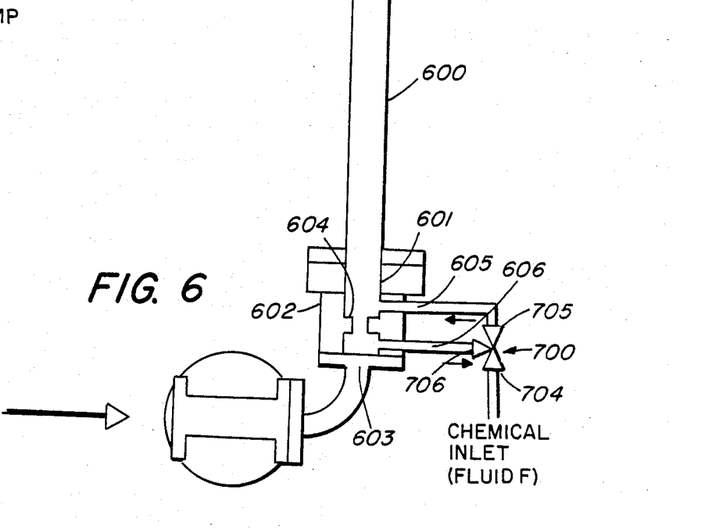
FIG. 6 shows a section of a tank port with schematic valve of a preferred embodiment.

FIG. 6 shows an axial cross section through a port 601 at a representative tank 600 having fluid inlet valve 700 so attached. Tank 600 may be, for instance, mixing tank 70 or measuring tank 32. Port 601 may be either a top or bottom port of tank 600. Port 601 comprises a wall portion 602 which is generally cylindrical, and which has an inlet 603 connected to a bulk fluid supply, such as to line 60 or a drain. An orifice plate 604 in port 601 constricts flow between tank 600 and inlet 603 so as to create a pressure differential between opposing sides of plate 604, with the high pressure on the upstream side. Wall portion 602 is drilled, and threaded inlets 605, 606 are tapped therein on opposing sides of plate 604, to accommodate a self rinsing valve 700.

Valve 700 controls the access of a fluid F to the tank 600. Fluid F may be, for instance, the ozone mixing gas or the transport gas $N_2$ used in tank 70, 32, or may be a treatment fluid such as the fluids F1, F2, F3 discussed in relation to FIG. 2. Valve 700 has an inlet port 704 in communication with a supply of the fluid F, and further has ports 705, 706 directly connected to the tapped holes 605, 606 of tank 600. Valve 700 is a three-way, two-position valve, with port 705 connected in a first position to port 706 so as to provide a bypass flow about orifice plate 604 when fluid flows between tank 600 and inlet 603, thereby rinsing the valve. In the second position port 706 connects to port 704, allowing fluid F to enter tank 600 at 606. The cylindrical wall 602 of port 601 may be drilled and tapped with a plurality of pairs of inlets similar to 605, 606, spaced around its circumference, so as to accommodate additional inlet valves for a plurality of different fluids F1, F2 etc. It will be understood that, in the preferred system, the schematic configuration of valves, treatment fluids and other gases of FIGS. 1–5 employs a physical layout of inlet valves similar to the valve 700 attached to the tank ports as illustrated in FIG. 6. In particular, each of valves 80, 88, 46, 34a, 34b, 34c may be so attached. Further, such a valve (not shown) may be attached to the top port of vessel 2 for each of the special fluids (isopopyl alcohol, sulfuric acid) discussed herein.

Having thus disclosed a preferred system according to the present invention, a particular method of practicing the invention with preferred treatment fluids will now be described.

A preferred method of using the invention involves an improvement of the "RCA" cleaning system for semiconductor wafers. The concentrations of fluids, the treatment times, and in some cases the composition of such fluids, are modified according to the practice of the present invention.

Initially, one or more semiconductor wafers are loaded in vessel 2 and the vessel is closed. Vessel 2 for use in a flow loop may, for instance, comprise modular stackable wafer carriers, as described in the earliest above-mentioned application, or may comprise a flow vessel having a door-like opening therein, for inserting standard wafer carriers. Vessel 2 is then sealed, and an optional pre-cleaning step is performed. Hot concentrated sulfuric acid cleaning fluid, preferably comprising 96% $H_2SO_4$ at 300° F. is introduced into vessel 2, and then circulated through the vessel and flow loop for 5–20 minutes. The acid may contain hydrogen peroxide, in a manner known in the art, or preferably may have ozone sparged therethrough, so as to provide a medium capable of oxidizing organics.

Following the preliminary cleaning with $H_2SO_4$, the $H_2SO_4$ is displaced out of vessel 2 in a top down fashion by closing vent 12 and valve 16 and opening a gas inlet valve (not shown) similar to valves 46, 80, of FIG. 3, at port 4. This flushes the $H_2SO_4$ downwardly through the bottom port 6 of vessel 2 whence the acid may be channelled by valves (not shown) to a recycling reservoir. When the $H_2SO_4$ is removed from the system, the gas is turned off, and a rinse commenced. From this point on, all processing steps until final drying are conducted with the vessel 2 and loop in a hydraulically full condition.

When the $H_2SO_4$ is entirely flushed from the system, vent 18 and valve 14 are closed, and valves 92, 96 opened to fill the vessel 2 with water from the bottom up. The vents and valves are then reversed to provide a downflow $H_2O$, which is continued until the rinse water is clean, as detected, for example, by a resistance reading in the range of 10 megohmns or more measured by sensor 100 or 102 at the drain. Inlet valve 92 is then closed.

The next treatment fluid is then metered in fluid delivery system 30 for the next processing step. In the preferred embodiment, the second treatment fluid is an oxidizing ammonium hydroxide fluid similar to the familiar SC-1 cleaning fluid, and having a 10% $NH_4OH$ solution with sufficient hydrogen peroxide added to inhibit etching of $SiO_2$ or $Si_3N_4$. This fluid is prepared in a manner previously described in relation to FIG. 2 above, by sequentially metering the desired quantities of treatment fluids through valves 34a, 34b into metering tank 32 and delivering them to the chemical mixing tank 70. The heater 86 is turned on and controlled to heat the $NH_4OH$ solution to 85° C. After a suitable volume of fluid has accumulated in mixing tank 70 in the appropriate concentration, it is ready for delivery to the fluid treatment loop 1. Alternatively, rather than metering the hydrogen peroxide into the metering tank 32 from a reservoir, an ozone generator may be provided and ozone bubbled into the mixing tank 70 via valve 88, as previously described in relation to FIG. 3. This manner of introduction of hydrogen peroxide employs a gas, which may be of greater purity than a liquid reagent, and enhances mixing in tank 70. The bubbling of the ozone in the mixing tank can provide an alternative or an additional source of $H_2O_2$ to the treatment fluid.

When the appropriate quantity of SC-1 type fluid is accumulated in the mixing tank, valve 62 (FIG. 3) is closed, valve 78 is opened, and gas pressure valve 80 at the top of the mixing tank is opened to provide pressurized gas for driving the fluid through conduit 60 to the inlet 10. At the flow loop 1, vent 18 is opened, valve 16 and vent 12 are closed, and valve 14 is opened. Then valve 92 to the inlet 10 is opened so that the ammonium hydroxide cleaning fluid travels along conduit 60 into the flow loop at the top port 4 of vessel 2, driving the preceding treatment fluid (the water rinse) downwardly through vessel 2 and out vent 18 to the drain. During this entire operation the treatment vessel 2 and the flow loop are maintained hydraulically full so that no bubbles or phase boundaries are encountered. The bubbles which may have been introduced by the ozone bubbling in tank 70 are allowed to separate at the phase boundary 75 in the mixing tank 70 before entering the flow loop.

The introduction of the ammonium hydroxide fluid at the top of vessel 2 causes displacement of water in the vessel downwardly without mixing. That is, the direction of the flow of the introduced fluid is against the flotation gradient of the introduced fluid with respect to the preceding fluid. Generally, in the process steps described herein, the same principal will dictate the direction of introduction of each fluid into the loop, e.g., with lighter fluids introduced at the top of the vessel 2 and heavier fluids introduced at the bottom of vessel 2. Conversely, in performing a rinse operation, the rinse water will be introduced in the direction of its flotation gradient with respect to the preceding fluid. That is, lighter fluids will be rinsed out by introducing water via the bottom port of vessel 2, and heavier fluids will be rinsed out by the introduction of water at the top port of vessel 2. An exception to this rule is described above in relation to the rinsing of $H_2SO_4$. In that case, where a concentrated reagent was rinsed from an emptied vessel, $H_2O$ was introduced bottom up to re-establish a hydraulically full condition for the first step of a rinse sequence.

Continuing now with the discussion of the preferred wafer cleaning method, after the introduction of the ammonium hydroxide fluid, valve 92 is closed, blocking valve 16 is opened, and the circulation pump 20 is turned on. The ammonium hydroxide solution then circulates for approximately 10 minutes, after which time it is rinsed out. The rinse is accomplished by closing valve 14 and vent 18, opening vent 12 and valves 16 and 92, so as to cause the introduction of water through bottom port 6 to fill vessel 2, rinsing it out through the drain 12.

At this point, a brief treatment of extremely dilute hydrofluoric acid HF is used to remove surface oxide and better expose organic contaminants for cleaning. This step is accomplished by controlling the hydrofluoric acid valve as discussed above in relation to FIG. 5, so as to provide a dilute solution of between 0.1 and 5%, and preferably between 0.5 and 1% HF at the inlet valve 92 to the system. Vent 12 and valve 16 are opened, and vent 18 and valve 14 closed, so that when valve 92 is opened the dilute hydrofluoric solution is introduced into vessel 2 at the bottom port thereof. The controlled introduction of the correct concentration of HF is accomplished by switching the tied valves 152, 154 to connect the flow of HF from the fine metering pump 148 to the mixing inlet of valve 92, while simultaneously controlling the inlet water flow using positioning valve 96, as discussed above with regard to FIG. 5, so as to achieve the desired concentration and flow rate. After ten to thirty seconds, the HF solution is purged from the vessel by simply halting the HF injection and continuing the water flow.

The next treatment fluid is an HCl-based fluid similar to the familiar semiconductor cleaning fluid SC-2, and comprises a 10% solution of hydrochloric acid with added hydrogen peroxide. This solution is prepared in fluid delivery system 30 as described in regard to FIG. 2 above, so as to provide a sufficient volume of the HCl and $H_2O_2$ solution in the mixing tank 70 to fill the fluid treatment loop 1. Heaters 86 around the mixing tank raise the temperature of the treatment fluid to 85° C., as discussed in relation to the ammonium hydroxide-based treatment fluid, and ozone may be bubbled through the mixing tank to promote mixing and to enhance its oxidizing abilities.

Valve 62 is then closed and valves 76, 78 opened to permit fluid to flow along the conduit 60 to the inlet 10. At the top of the mixing tank valve 80 is opened, and pressurized gas drives the prepared HCl treatment fluid through conduit 60. At the treatment loop 1, valve 16 and vent 12 of the flow loop are opened, valve 14 and vent 18 are closed, and valve 92 at the inlet 10 opened to permit fluid from tank 70 to enter the flow loop. The fluid then enters the flow loop, filling vessel 2 through bottom port 6 and displacing the water rinse upwardly out of vent 12 to the drain. When the conductivity sensors 100, 102 determine that the HCl fluid has fully displaced the water from the vessel 2, inlet valve 92 is closed, valve 14 opened, and the circulation pump 20 is turned on and brought up to speed to circulate the solution for 10 minutes. The HCl solution is then removed, by setting the vents and valves to provide a top-down introduction of a water rinse, in a manner similar to, (but with flow direction reversed from) that described for the SC-1 treatment fluid.

After the final cleaning and rinse steps as just described, valves 14, 16 and vent 12 are closed, vent 18 is opened, and a flow of heated drying medium is introduced through the vessel 2. Preferably the drying fluid is an azeotrope-forming vapor, such as isopropyl alcohol, as described with regard to FIG. 4, above. Alternatively, a conventional solvent-based rinse may be used, such as sustained hot methanol rinse followed by methanol vapor/hot gas purge.

In one prototype embodiment the various valves are all diaphragm valves, pneumatically controlled by a common 60 psi pressure source. The proper sequence and timing of the valves is controlled by a computer program run on a microprocessor to effect the desired mixing, heating, delivery and circulation of fluids, and drying as outlined above.

The apparatus and method according to the invention having been thus described, other variations and improvements may occur to those skilled in the art, and all such variations and improvements are within the scope of the invention, as defined by the following claims.

What is claimed is:

1. A method for the fluid treatment of semiconductor wafers, such method comprising the steps of
    providing a treatment vessel having first and second fluid-sealable ports and means defining a flow path within said vessel between said ports,
    supporting the wafers in the flow path,
    providing a flow segment outside the vessel extending between said first and second ports, the flow segment comprising, in sequence, a first vent, a first valve, an inlet, a second valve and a second vent, and
    circulating a homogeneous stream of treatment fluid in a flow loop defined by said vessel and said flow segment, while maintaining said flow loop full of said fluid thereby treating the wafers by contacting them with circulating fluid.

2. The method of claim 1, further including the step of maintaining the flow loop hydraulically full.

3. The method of claim 2, further including the step of controlling the said vents and valves to fill the vessel through a selected one of said first and second ports while maintaining the vessel full.

4. The method of claim 3, further including the step of heating the treatment fluid.

5. The method of claim 4, further including the step of providing a flow of drying medium through the treatment vessel.

6. The method of claim 5, further including the steps of iteratively rinsing the vessel and filling the vessel with a further treatment fluid, while maintaining the vessel hydraulically full, before the step of providing said flow of drying medium.

7. A method for the fluid treatment of semiconductor wafers, such method comprising the steps of
supporting a wafer in a fluid-receiving treatment vessel,
metering a charge of treatment fluid by withdrawing a metered amount of a fluid from a closed hydraulically full system which communicates with a reservoir of treatment fluid thereby simultaneously drawing an inflow of treatment fluid from the reservoir of treatment fluid into the hydraulically full system, and causing said metered amount of the treatment fluid to enter into the system, and
delivering a charge of fluid thus metered from the system to the treatment vessel and circulating the charge of fluid past the wafer supported in the vessel for treating the wafer.

8. The method of claim 7, further including the step of circulating the fluid through the vessel.

9. The method of claim 8, further including the step of rinsing the vessel with a rinse fluid, wherein the step of delivering the fluid to the treatment vessel and the step of rinsing the vessel are each performed while maintaining the vessel hydraulically full.

10. The method of claim 9, including the steps of iteratively performing said metering, delivering, circulating and rinsing with a sequence of treatment fluids.

11. The method of claim 8, further including at least one of the steps of heating, mixing and degassing the treatment fluid.

12. The method of claim 8, wherein the step of permitting the inflow of a treatment fluid into the system is accomplished by permitting said inflow at a top or bottom fluid level against the flotation gradient of the treatment fluid in the system.

* * * * *